(12) United States Patent
Hu

(10) Patent No.: US 11,362,450 B2
(45) Date of Patent: Jun. 14, 2022

(54) ELECTRONIC DEVICE HAVING A POSITIONING ASSEMBLY HAVING A GUIDE BAR AND AN ELASTIC COMPONENT

(71) Applicant: Fulian Precision Electronics (Tianjin) Co., LTD., Tianjin (CN)

(72) Inventor: Chih-Wei Hu, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 31 days.

(21) Appl. No.: 16/883,910

(22) Filed: May 26, 2020

(65) Prior Publication Data

US 2021/0288428 A1 Sep. 16, 2021

(30) Foreign Application Priority Data

Mar. 12, 2020 (CN) .......................... 202010172377.0

(51) Int. Cl.
*H01R 13/15* (2006.01)
*H05K 1/14* (2006.01)
*H01R 13/05* (2006.01)

(52) U.S. Cl.
CPC ............. *H01R 13/15* (2013.01); *H01R 13/05* (2013.01); *H05K 1/141* (2013.01)

(58) Field of Classification Search
CPC ......... H01R 13/15; H01R 13/05; H05K 1/141
USPC ....................................................... 439/44
See application file for complete search history.

(56) References Cited

U.S. PATENT DOCUMENTS

| | | | |
|---|---|---|---|
| 5,850,147 A * | 12/1998 | Stowers | H01R 12/714 324/755.05 |
| 6,424,166 B1 * | 7/2002 | Henry | G01R 1/0483 324/754.08 |
| 6,696,850 B1 * | 2/2004 | Sanders | G01R 1/06711 324/755.05 |
| 6,835,095 B2 * | 12/2004 | Chen | H01R 24/54 439/578 |
| 6,856,152 B2 * | 2/2005 | Hidehira | G01R 31/2812 324/750.25 |
| 7,259,576 B2 * | 8/2007 | Parker | G01R 1/06722 324/755.05 |
| 8,044,673 B1 * | 10/2011 | Burgyan | G01R 1/0466 324/750.16 |

(Continued)

FOREIGN PATENT DOCUMENTS

CN 205371197 U 7/2016
CN 107039845 A 8/2017

*Primary Examiner* — Alexander Gilman
(74) *Attorney, Agent, or Firm* — ScienBiziP, P.C.

(57) ABSTRACT

An electronic device includes a first connection module, a second connection module, and a positioning assembly. The positioning assembly includes a guide pin, a guide post, a guide bar, and an elastic component. The guide pin is fixed on a first surface of the first connection module, and the guide post is fixed on a second surface of the second module. The electronic device includes a positioning assembly which serves to position components during the installation of the electronic device. The positioning assembly provides space for positional adjustment to the first component and the second component and the elasticity of the elastic component avoids crushing or handling damage to the first component and the second component.

9 Claims, 6 Drawing Sheets

(56) References Cited

U.S. PATENT DOCUMENTS

| | | | | |
|---|---|---|---|---|
| 8,506,307 | B2* | 8/2013 | Henry | G01R 1/06738 |
| | | | | 439/66 |
| 9,110,097 | B2* | 8/2015 | Becker | G01R 31/2865 |
| 9,209,548 | B2* | 12/2015 | Henry | G01R 1/06738 |
| 10,069,257 | B1* | 9/2018 | Soubh | H01R 9/0527 |
| 2011/0318959 | A1* | 12/2011 | Uesaka | H01R 13/2492 |
| | | | | 439/581 |
| 2019/0131728 | A1* | 5/2019 | Mardi | H01R 13/2421 |

* cited by examiner

ELECTRONIC DEVICE HAVING A POSITIONING ASSEMBLY HAVING A GUIDE BAR AND AN ELASTIC COMPONENT

CROSS-REFERENCE TO RELATED APPLICATIONS

This application claims priority to Chinese Patent Application No. 202010172377.0 filed on Mar. 12, 2020, the contents of which are incorporated by reference herein.

FIELD

The subject matter herein generally relates to electronic products.

BACKGROUND

Due to limited space in an electronic device, distances between various components are small. Existing design and placement during manufacture does not provide effective positioning for each component, it is time-consuming, and components can be easily damaged.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
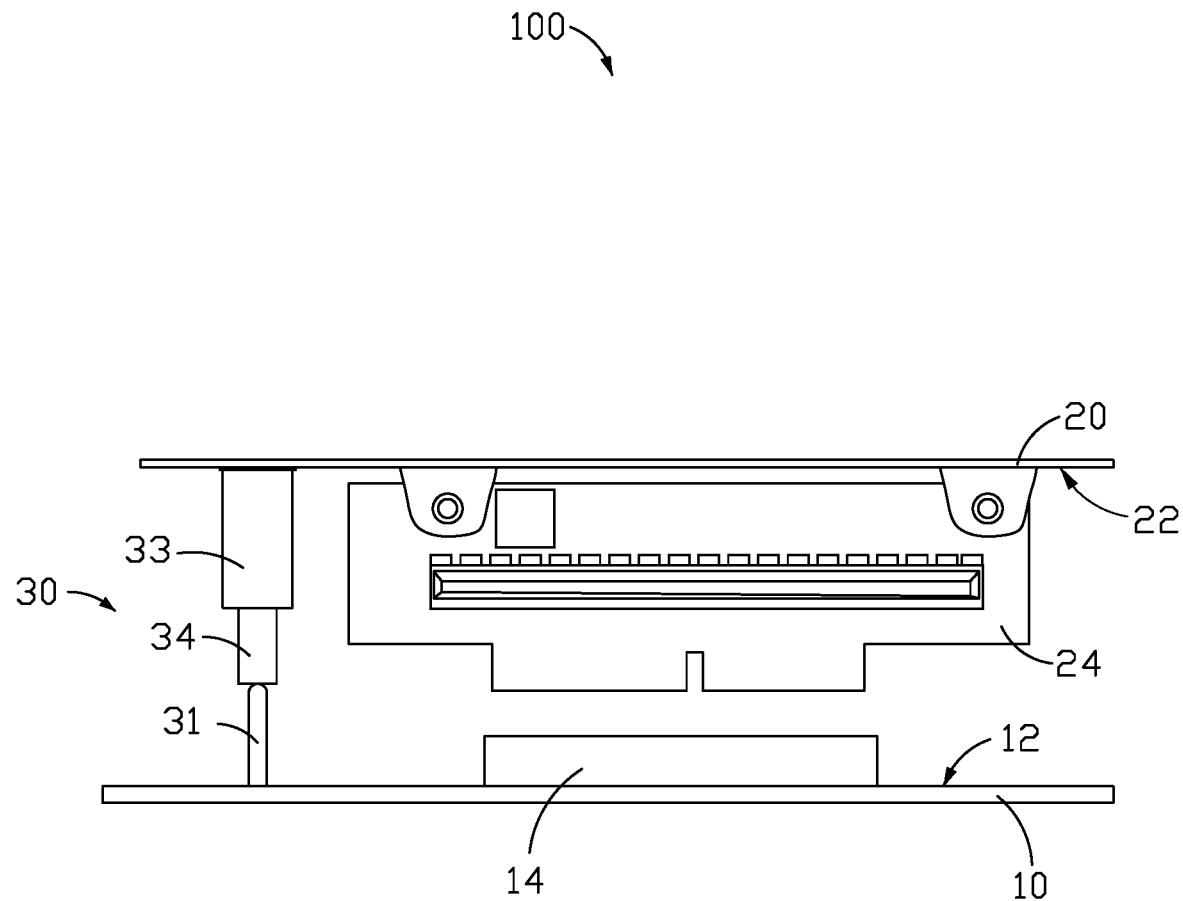
FIG. 1 is a front view of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. It should be noted that references to "an" or "one" embodiment in this disclosure are not necessarily to the same embodiment, and such references mean "at least one."

The term "comprises" means "including, but not necessarily limited to"; it specifically indicates open-ended inclusion or membership in a so-described combination, group, series, and the like.

Figure 2:
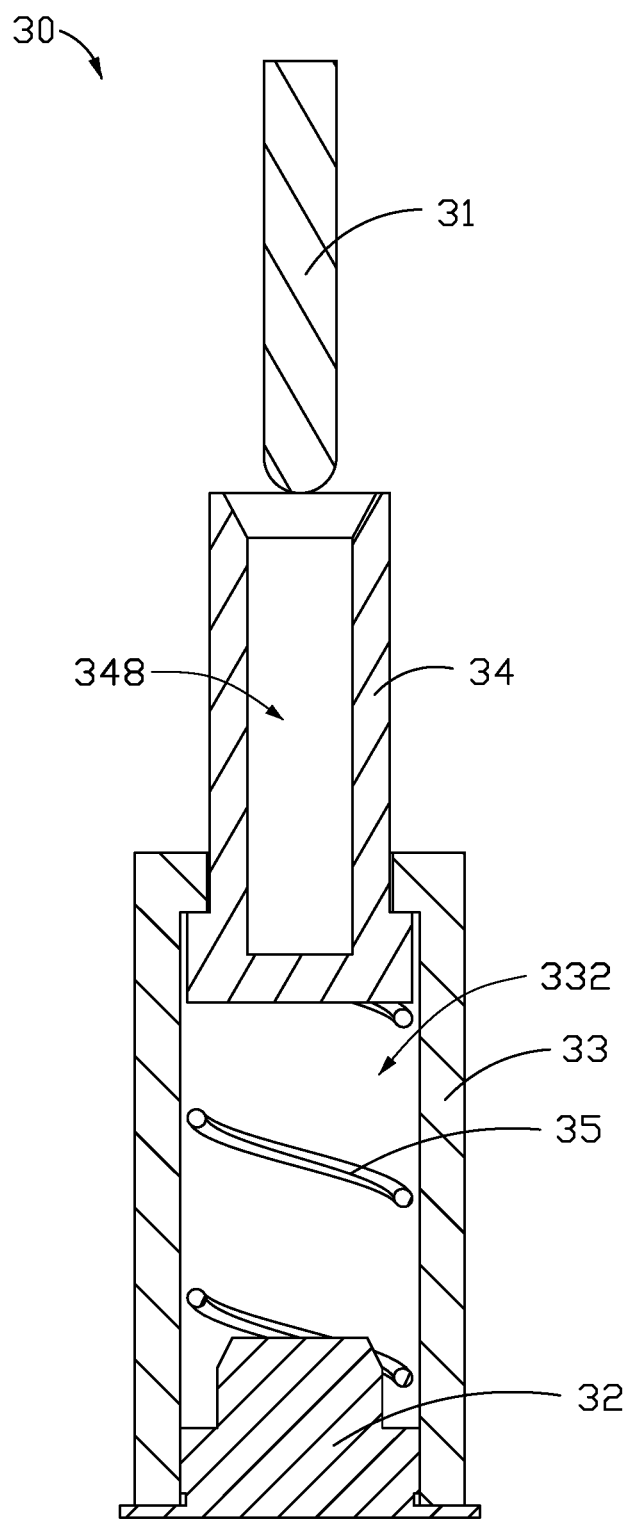
FIG. 2 is a cross-sectional view of a positioning assembly of the electronic device of FIG. 1.

Referring to FIG. 1 and FIG. 2, in one or more embodiments, the electronic device 100 includes a first connection module 10, a second connection module 20, and a positioning assembly 30. The positioning assembly 30 is disposed between the first connection module 10 and the second connection module 20. When the first connection module 10 and the second connection module 20 are assembled and connected, the positioning assembly 30 can position the first connection module 10 and the second connection module 20.

In at least one embodiment, the first connection module 10 includes a first surface 12, the second connection module 20 includes a second surface 22, and the first surface 12 is disposed toward the second surface 22. In one embodiment, the first surface 12 is parallel to the second surface 22. A first component 14 is located on the first surface 12, a second component 24 is located on the second surface 22, and the first component 14 is matched and connected to the second component 24. In one embodiment, the first component 14 is a connector, and the second component 24 is a circuit board.

Figure 3:
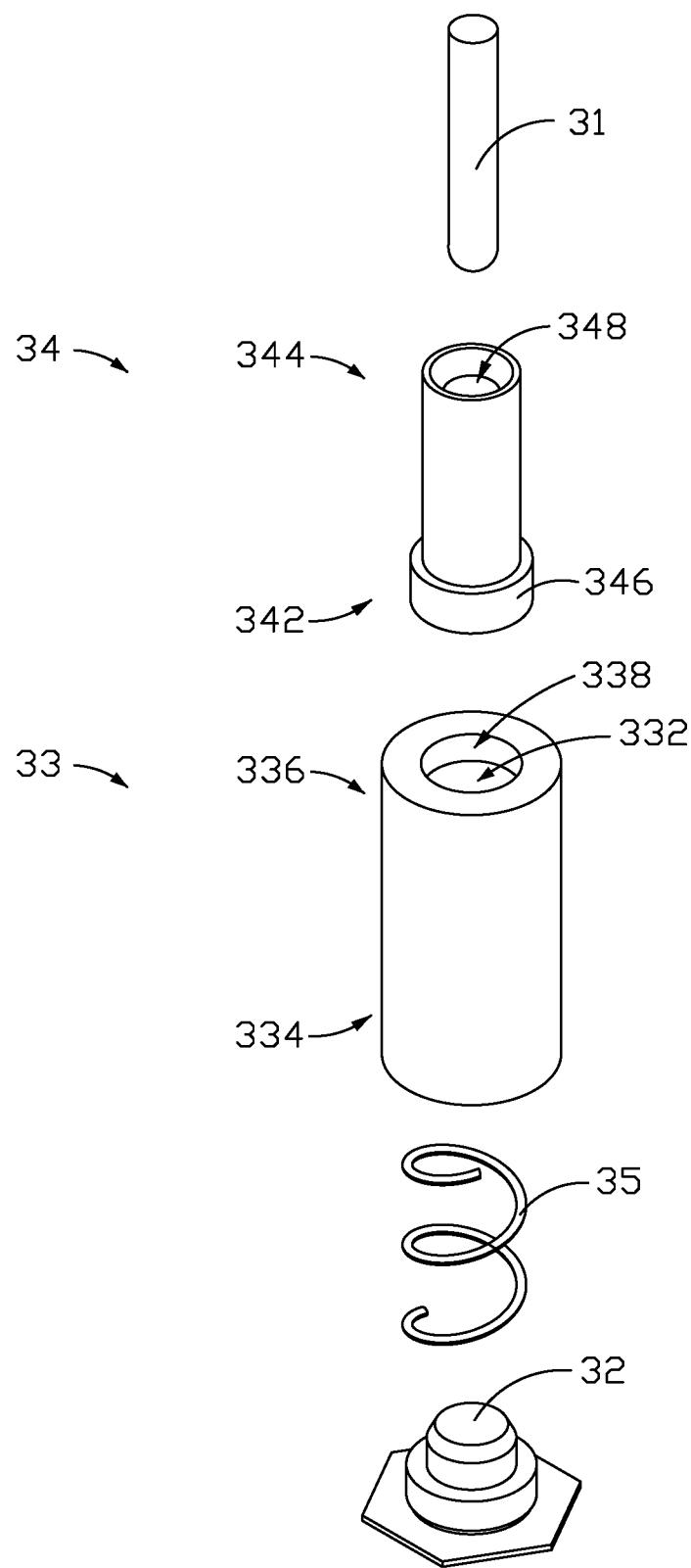
FIG. 3 is an exploded view of the positioning assembly of FIG. 2.

Referring to FIG. 3, the positioning assembly 30 includes a guide pin 31, a base 32, a guide post 33, a guide bar 34, and an elastic component 35.

In at least one embodiment, the guide pin 31 is fixedly disposed on the first surface 12 of the first connection module 10. The guide pin 31 is substantially columnar, and the guide pin 31 is perpendicular to the first surface 12 along an axial direction of the guide pin 31.

In at least one embodiment, the base 32 is fixed on the second connection module 20. The base 32 is located in an area of the second surface 22 corresponding to the guide pin 31.

In at least one embodiment, the guide post 33 is fixed on the second connection module 20, and the guide post 33 is located in the same area of the second surface 22 as the base 32. The guide post 33 has a hollow column inside. That is, the guide post 33 has a through hole 332, and an opening direction of the through hole 332 is perpendicular to the second surface 22. The guide post 33 includes a first end 334 and a second end 336. The first end 334 is close to the second connection module 20, and the second end 336 is away from the second connection module 20. In at least one embodiment, the first end 334 of the guide post 33 is sleeved on the base 32, to be fixed on the second connection module 20.

In at least one embodiment, the second end 336 of the guide post 33 is provided with a blocking portion 338 that extends from an inner wall of the through hole 332 toward the center of the through hole 332.

In other embodiments, the guide post 33 and the base 32 may be integrally formed.

In at least one embodiment, the guide bar 34 is substantially cylindrical, and the guide bar 34 is movably accommodated in or protrudes from the through hole 332. The guide bar 34 includes a third end 342 and a fourth end 344. The third end 342 is provided with a protrusion 346 which cooperates with the blocking portion 338 to prevent the guide bar 34 from dropping out of the second end 336 of the blocking portion 338.

In at least one embodiment, the guide bar 34 is provided with a receiving groove 348. An opening direction of the receiving groove 348 faces the guide pin 31, and the size of the receiving groove 348 is substantially the same as the size of the guide pin 31. The receiving groove 348 receives the guide pin 31, and the guide pin 31 is movably received therein.

In at least one embodiment, the elastic component 35 elastically bears between the third end 342 of the guide bar 34 and the base 32. The elastic component 35 adjusts a distance between the guide bar 34 and the base 32, thereby adjusting the distance between the first connection module 10 and the second connection module 20. Referring to FIG. 2, when the elastic component 35 is uncompressed, the protrusion 346 and the blocking portion 338 resist each other, and the fourth end 344 is farthest from the base 32. When the elastic component 35 is compressed to the maximum, the third end 342 bears against the base 32, and the fourth end 344 is closest to the base 32.

In at least one embodiment, the elastic component 35 is a spring.

In at least one embodiment, the base 32 may be omitted, and one end of the elastic component 35 can bear against the second surface 22 of the second connecting module 20 or the first end 334 of the guide post 33.

Figure 4A:
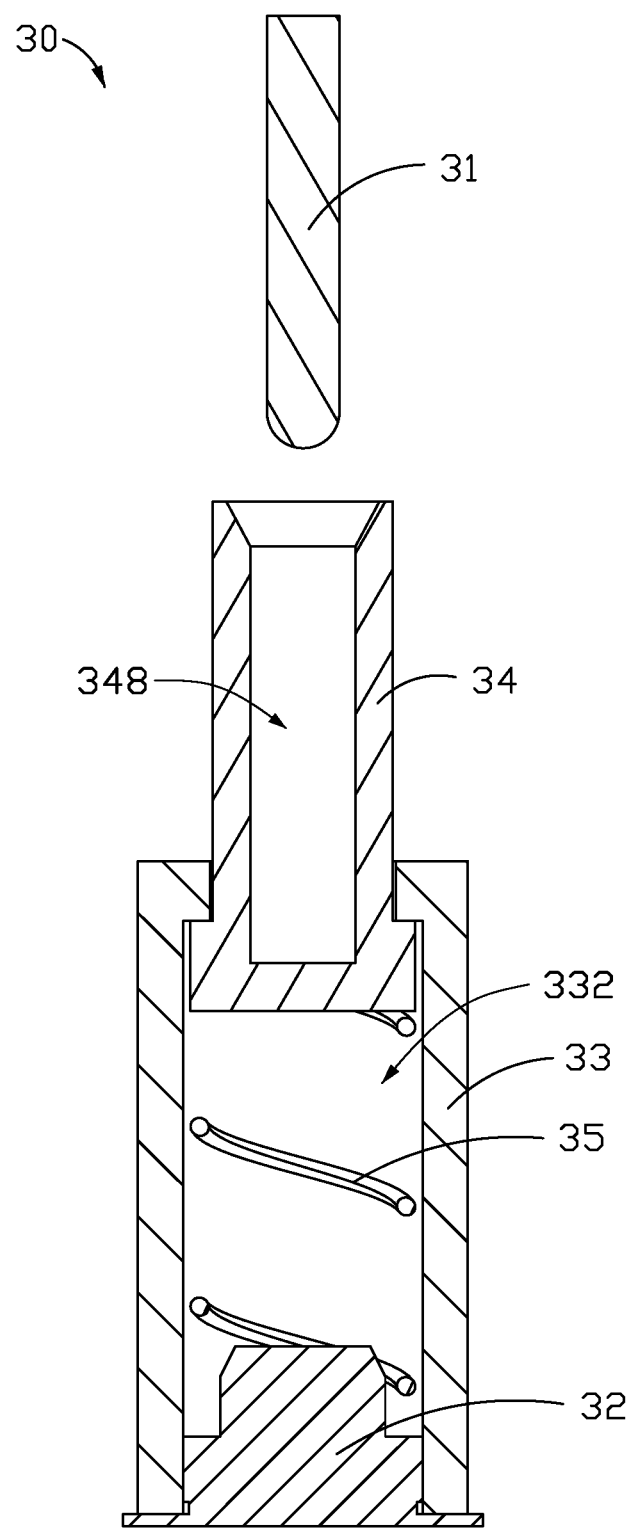
FIG. 4A is a cross-sectional view of a positioning assembly of the electronic device of FIG. 1 in a first state.
Figure 4B:
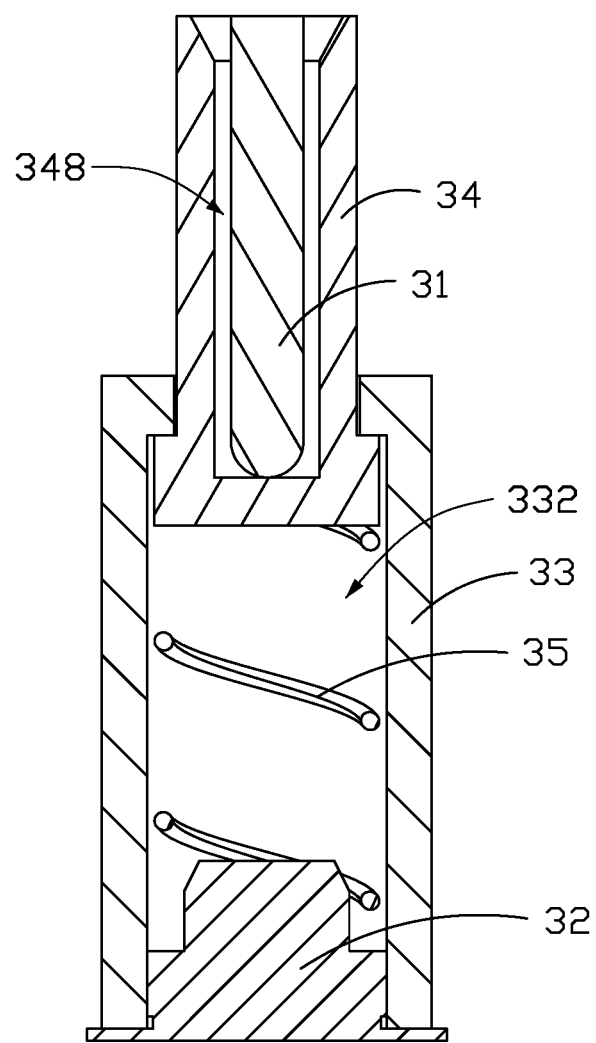
FIG. 4B is a cross-sectional view of a positioning assembly of the electronic device of FIG. 1 in a second state.
Figure 4C:
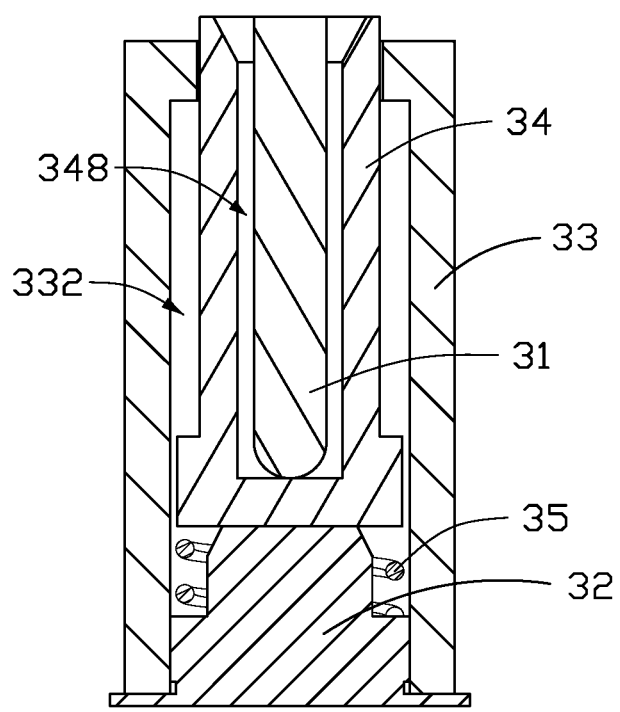
FIG. 4C is a cross-sectional view of a positioning assembly of the electronic device of FIG. 1 in a third state.

In at least one embodiment, during the assembly of the electronic device 100, the electronic device 100 has a first state, a second state, and a third state. The first state is illustrated in FIG. 4A, the second state is illustrated in FIG. 4B, and the third state is illustrated in FIG. 4C. When the electronic device 100 is in the first state, the guide pin 31 protrudes completely from the receiving groove 348 and the first end 334 of the guide bar 34 protrudes from the through hole 332. When the electronic device 100 is in the second state, the guide pin 31 is received in the receiving groove 348 and the first end 334 of the guide bar 34 extends out of the through hole 332. When the electronic device 100 is in the third state, the guide pin 31 is received in the receiving groove 348 and the guide bar 34 is received in the through hole 332.

In at least one embodiment, when assembling the first connection module 10 and the second connection module 20, the first component 14 and the second component 24 need to be matched and connected to each other.

In at least one embodiment, when the electronic device 100 is changed from the first state to the second state, the first connection module 10 and the second connection module 20 are close to each other. Then, the distance between the guide pin 31 and the guide bar 34 becomes smaller, until the guide pin 31 is in contact with the fourth end 344 of the guide bar 34. The first component 14 and the second component 24 are not in contact, so there is sufficient distance to adjust positions of the first component 14 and the second component 24, which prevents damage to the first component 14 and/or the second component 24 by changing their positions after the first component 14 and the second component 24 are in contact. When the electronic device 100 changes from the second state to the third state, the distance between the first component 14 and the second component 24 decreases. If there is no distance between the guide pin 31 and the receiving groove 348 (referring to FIG. 1 again), the first component 14 and the second component 24 are spaced apart. Then the guide pin 31 extends into the receiving groove 348, and the elastic component 35 is compressed. If the electronic device 100 is in the third state, the first component 14 and the second component 24 are matched and connected, the elastic component 35 provides sufficient elasticity to avoid any collision or crushing damage between the first component 14 and the second component 24.

In at least one embodiment, the electronic device 100 includes a positioning assembly 30 that functions to position components. The positioning assembly 30 includes the guide bar 34 that is movably disposed of the positioning assemble 30 and the elastic component 35 that is connected to the guide bar 34. The positioning assembly 30 ensures that the first component 14 and the second component 24 on the electronic device 100 have enough space for adjustment. The elasticity of the elastic component 35 acting as a damper or shock absorber prevents damage to the first component 14 and the second component 24. The positioning assembly 30 has few components, is easy to manufacture, is convenient to install, and does not occupy additional space.

It should be emphasized that the above-described embodiments of the present disclosure, including any embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. An electronic device comprising:
    a first connection module comprises a first surface;
    a second connection module comprises a second surface, wherein the second surface is disposed toward the first surface;
    a positioning assembly comprises:
    a guide pin which is fixedly disposed on the first surface;
    a guide post which is fixedly disposed on the second surface, wherein the guide post comprises a through hole;
    a guide bar which is movably accommodated in or protrudes from the through hole, wherein the guide bar comprises a receiving groove, and the guide pin is movably accommodated in or protrudes from the receiving groove;
    an elastic component which is elastically resists between the guide bar and the second connection module;
    wherein the electronic device is switchable among a first state, a second state, and a third state; wherein in the first state, the guide bar protrudes partially from the through hole, and an entirety of the guide pin protrudes from the receiving groove; in the second state, the guide bar protrudes partially from the through hole, and the entirety of the guide pin is accommodated in the receiving groove; and in the third state, the guide bar is accommodated in the through hole, and the entirety of the guide pin is accommodated in the receiving groove.

2. The electronic device according to claim 1, wherein the first surface is parallel to the second surface, the guide pin is perpendicular to the first surface, and the guide bar is perpendicular to the second surface.

3. The electronic device according to claim 1, wherein a blocking portion is provided at an end of the guide post away from the second surface, and the guide bar comprises a protrusion, and the protrusion is used to cooperate with the blocking portion to prevent the guide bar from disengaging from the guide post.

4. The electronic device according to claim 1, wherein the positioning assembly comprises a base, and the base is fixed on the second surface and accommodated in the through hole.

5. The electronic device according to claim 4, wherein one end of the elastic component is fixed on the base.

6. The electronic device according to claim 4, wherein the base and the guide post are integrally formed.

7. The electronic device according to claim 1, wherein the elastic component is a spring.

8. The electronic device according to claim 1, further comprises a first component and a second component, the first component is fixed on the first surface and the second component is fixed on the second surface, and if a distance between the guide pin and the receiving groove is zero, the first component and the second component are spaced apart.

9. The electronic device according to claim 8, wherein the first component is a connector, and the second component is a circuit board.

* * * * *